United States Patent

Onetti et al.

[11] Patent Number: 5,812,687
[45] Date of Patent: Sep. 22, 1998

[54] CIRCUIT FOR CONTROLLING THE FREQUENCY AND/OR PHASE RESPONSE OF A SIGNAL AMPLIFICATION SYSTEM

[76] Inventors: Andrea Mario Onetti, 9 Via Cavallotti, 27100 Pavia, Italy; Maurizio Tonella, 27 Via M. Nero, 20011 Corbetta, Italy

[21] Appl. No.: 393,097

[22] Filed: Feb. 22, 1995

[30] Foreign Application Priority Data

Feb. 25, 1994 [EP] European Pat. Off. .............. 94830088

[51] Int. Cl.⁶ ..................................................... H03G 5/00
[52] U.S. Cl. .............................. 381/97; 381/98; 330/144; 327/237
[58] Field of Search .............................. 381/97, 104, 106, 381/98, 94, 94.1; 330/126, 306, 144, 145, 284; 327/231, 237; 364/571.01

[56] References Cited

U.S. PATENT DOCUMENTS 4,805,126  2/1989  Rodems ............................ 364/571.01
5,201,009  4/1993  Yamada et al. .

FOREIGN PATENT DOCUMENTS 2148644  5/1985  United Kingdom .

OTHER PUBLICATIONS

Patent Abstracts of Japan, vol. 17, No. 494 (E–1428) Sep. 7, 1993 & JP–A–05 122 795 (NEC Corp).

*Primary Examiner*—Minsun Oh Harvey
*Attorney, Agent, or Firm*—Allen, Dyer, Doppelt, Milbrath & Gilchrist, P.A.

[57] ABSTRACT

A circuit for controlling frequency and/or phase response characteristic of a signal amplification system or channel has a serial architecture composed of a plurality of cells and a selector for deriving the signal after any one of the cascaded cells. At least one component of the RC network of each cell is in the form of a plurality of elements connected in series, each of the elements having a value which is a fraction of the design value of the component. A short-circuiting switch is associated with each element; the overall effect may be chosen by selecting the derivation node of the output signal and a certain configuration of the short-circuiting switches of the RC networks of the various cells. An outstanding flexibility of selection is achieved.

19 Claims, 3 Drawing Sheets

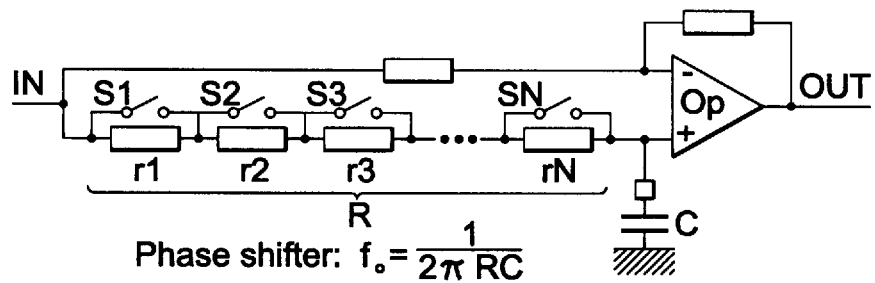
Phase shifter: $f_o = \dfrac{1}{2\pi RC}$
FIG. 7.
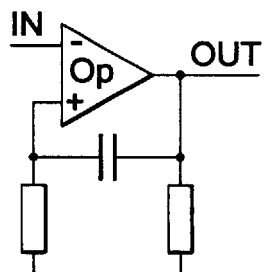
FIG. 8.
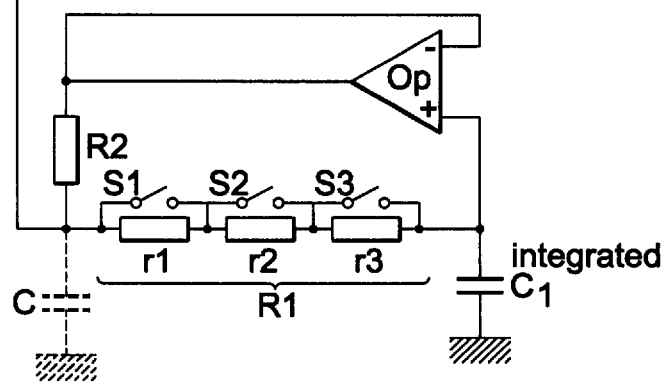

CIRCUIT FOR CONTROLLING THE FREQUENCY AND/OR PHASE RESPONSE OF A SIGNAL AMPLIFICATION SYSTEM

CROSS-REFERENCE TO RELATED APPLICATION

This application claims priority from EP 94830088.4, filed Feb. 25, 1994, which is hereby incorporated by reference. However, the content of the present application is not necessarily identical to that of the priority application.

BACKGROUND AND SUMMARY OF THE INVENTION

The present invention relates to a circuit for controlling the frequency and/or phase response of a signal amplification system, particularly for audio systems, for implementing equalization functions and/or for creating special effects in audio reproduction, as for example the so-called "surround" effect in stereo systems.

The complex equalization requirements in analog signal amplification systems, for compensating intrinsic frequency response characteristics of system's components and/or for synthetically optimizing frequency and/or phase response characteristics of the amplification system and/or for realizing special effects, as for example the so-called surround effect in stereo audio systems, commonly raise the need of implementing a plurality of circuit blocks for modifying the transfer characteristics, the effect of which may be specifically selected or deselected in order to obtain a certain overall result.

Commonly, in audio systems of relatively compact size, for example in magnetic tape or compact disc playback systems to be installed in cars or portable systems, so-called nested, serial architectures (in terms of signal path) are preferred because they are less burdensome in terms of circuit complexity and introduced distortion than equivalent parallel architectures. Parallel architectures do in fact require multipliers along the signal path that tend to introduce a second harmonic distortion, which is particularly noxious in audio systems.

On the other hand, the need of limiting the number of componets external to an integrated circuit and at the same time of reducing the size of the integrated circuit itself, favors the use of nested serial structures, wherein the signal being treated may selectively be derived from any point of a chain of circuit blocks of equalization/modification cells of the frequency and/or phase response characteristic of the amplification system. Depending from the type of effect that should be produced by the nested serial modification structure, the latter may comprise a series of purely phase-shifting cells and/or of emphasis (amplifying) or de-emphasis (attenuating) cells.

An important example of these systems is represented by the circuits used for implementing a so-called "surround" effect in stereo audio systems. In this case, the audio signal, in transfer through one of the stereo channels undergoes a phase-shift at certain frequencies of the audio spectrum according to a selected surround mode. The signal passes through a series of blocks or cells, each containing a phase-shifting circuits having a certain transfer characteristic, that is a certain cut-off frequency of intervention, commonly determined by an RC network. The conditioned signal may be tapped from any point of the chain of phase-shifting cells, selectably by the operator. Such a system is schematically shown in FIG. 1.

Of course, the single phase-shifting (or frequency response modifying) cells may have a specific configuration. FIGS. 2, 3, 4, 5 and 6 show different filter and/or phase-shifting cells, which may be used according to needs in equalization systems and/or for implementing certain effects. Basically, each cell comprises an RC circuit suitable to establish a certain frequency and/or phase-shifting response (i.e. a certain transfer function).

As depicted in FIG. 1, selection of the "tapping" point of the signal from anyone of the chain of (nested) cells, permits to select a certain overall modifying or optimizing characteristic, in terms of frequency and/or phase response, for the relative channel or amplification system.

In the case of a nested serial circuit, suitable to implement a "surround" effect in a stereo audio system, each phase-shifting cell may consist in a circuit as the one shown in FIG. 2.

On the other hand, in an audio system frequencies are those of the so-called audio band (i.e. a low frequency spectrum) and therefore such frequency and/or phase response modifying circuits normally require the use of large capacitors that are commonly connected externally to the integrated circuit, or special capacitance multiplying circuits are integrated in order to limit the number of external components.

Commonly, in known systems, each cell is designed so as to produce a certain effect which, singularly or in combination with the effect produced by other selected cells of the chain, permits to achieve a certain overall effect on the frequency and/or phase response characteristics of the amplifier, by selecting the point at which is signal is derived (tapped) for further processing.

In the case of nested serial structures, an overall optimization of the chain in its whole restrains the possibility of a specific optimization of the single cells, because the characteristics of the single cells must combine with each other for producing a certain overall effect, selectable among different combinations made possible by a selector.

Such an aspect of nested serial systems of the known type implies limitations and drawbacks both in terms of performance as well as in terms of a reduced flexibility of regulation.

Normally, in integrated systems, the value of integrated resistances dictates the choice of the value of the external capacitor or capacitors of the RC network of the various cells. Therefore, varying the value of the externally connected component (commonly a capacitor) of a certain cell for optimizing its characteristics, implies a modification of the response characteristics relative to various combinations of the same cell with other cells of the nested chain.

Whenever such limitations of nested serial systems is untolerable, the problem is commonly avoided by renouncing a nested serial structure (notwithstanding its convenience) in favor of a parallel structure, though more costly and likely to introduce harmonic distortion problems.

There is a clear need for a circuit for adjusting the frequency and/or phase response characteristics of a signal amplification system, which, though retaining a nested serial architecture, has an improved flexibility of regulation or optimization, comparable to that of a parallel system.

This objective is fully achieved by the circuit made in accordance with the present invention, in which in each cell of a nested serial structure, at least one component of the RC circuit is realized in the form of a plurality of elements, each element having a fraction of the design value of the component. These elements are connected in series to each other and associated with a plurality of by-pass switches, each of which is functionally capable of short-circuiting at least one of the elements. The configuration of the by-pass switches is controlled by a dedicated control circuit programmable by the operator. Thus each cell may be individually optimized, independently from the others. Moreover, an extremely large number of response characteristics, determined both by selecting the point for tapping the signal of the nested serial chain as well as from the configuration of the bypass switches for each of the cells that are functionally active along the signal path, may be implemented.

BRIEF DESCRIPTION OF THE DRAWING

The disclosed inventions will be described with reference to the accompanying drawings, which show important sample embodiments of the invention and which are incorporated in the specification hereof by reference, wherein:

FIG. 7 shows a phase-shifting cell, functionally similar to the cell of FIG. 2, modified according to the present invention;

FIG. 8 shows an emphasis (amplifying) or de-emphasis (attenuating) cell, functionally similar to the cell of FIG. 4, but employing an integrated capacitance suitably multiplied by a capacitance multiplier circuit, the ratio of which may be programmed by the operator, according to the present invention.

DETAILED DESCRIPTION OF THE PREFERRED EMBODIMENTS

Figure 1:
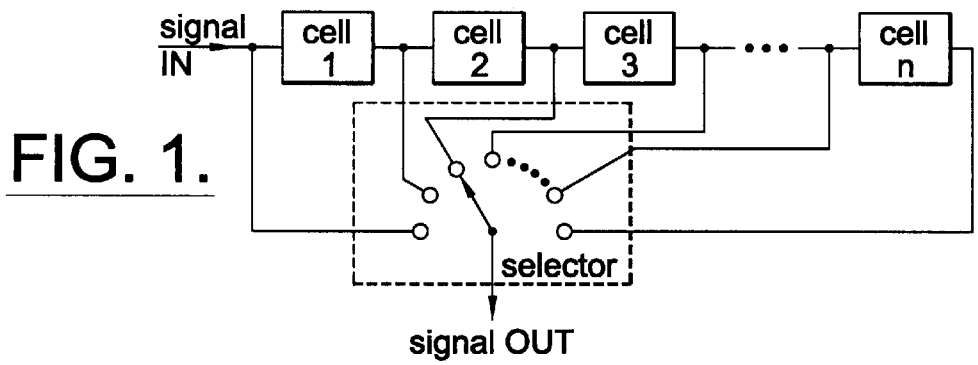
FIG. 1 shows a diagram of a nested serial system of modification/optimization of the frequency and/or phase response characteristics of a certain amplifying system or channel.
Figure 2:
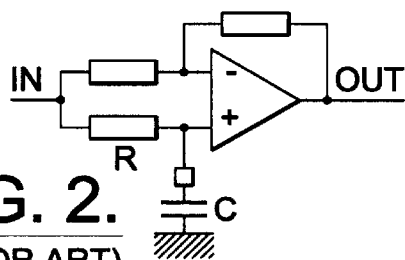
FIGS. 2, 3, 4, 5 and 6 show circuits suitable for implementing single cells of the nested serial system of signal processing of FIG. 1, that may be used depending on the type of effects that are required.

The numerous innovative teachings of the present application will be described with particular reference to the presently preferred embodiment (by way of example, and not of limitation), in which:

An object of the invention is a circuit for controlling frequency and/or phase of response characteristics of a signal amplification channel or system having a nested serial architecture comprising a plurality of phase-shifting and/or emphasis and/or de-emphasis cells, as schematically depicted in FIG. 1. Of course the available selection options may also be different from the one depicted in FIG. 1, by employing a different selector or functionally similar selection circuits. It is important to underscore the fact that the sample electrical diagrams shown in the figures have a purely illustrative purpose and they should not be intended as limiting to the specific examples the field of application of the device and/or the process of the invention.

As already said above, depending on the effects that are sought, the nested serial system for signal processing may employ cells of different type, examples of which are shown in FIGS. 2–6. In the case of a system designed to produce a so-called surround effect during stereophonic play back, the circuit may employ a plurality of phase-shifting cells, for example of the type shown in FIG. 2. A cell or circuit of this type is substantially a all-pass filter, capable of introducing phase-shift in a frequency band centered on a certain frequency $f_0$ of the audio spectrum, which is determined by:

$$f_0 = \frac{1}{2\pi RC}$$

Basically, each of the various cells will have its own cut-off or center frequency of intervention and the respective frequencies may be distributed, according to said criteria, throughout the audio band.

The particular selection by the operator, of the point from which the signal is derived, will determine the selection of a certain surround effect, among a plurality of selectable effects.

Figure 3:
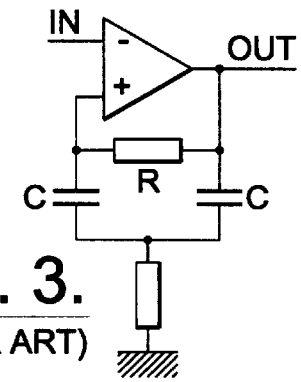
Figure 4:
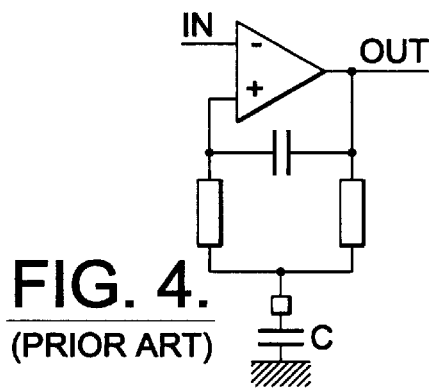

The cells shown in FIGS. 3 and 4, are clearly biquadratic cells (i.e. cells having a transfer function that comprises quadratic functions both in the numerator and in the denominator). These cells substantially have a bell-shaped frequency response characteristic (band-pass) and are commonly employed in audio processors for implementing, for example, a tone control function, or the like. The transfer functions of cells 3 and 4 are substantially similar.

Figure 5:
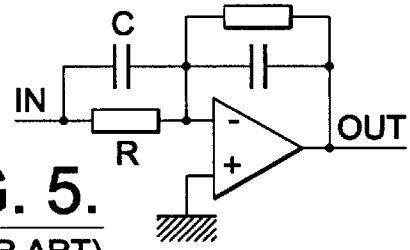

The cell shown in FIG. 5 has a transfer function showing a frequency response characteristic of the band-pass type and a gain lower than or equal to unity. This type of cell is commonly employed in de-emphasis (attenuating) circuits.

Figure 6:
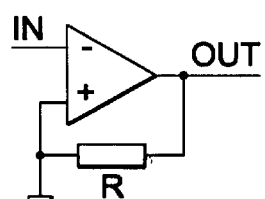

The cell of FIG. 6 shows a typical emphasis (amplifying) circuit for high frequency tones (i.e. having the characteristic of a high-pass filter) suitable to produce a in-band gain greater than unity.

A sample embodiment of the invention is schematically depicted in FIG. 7. Functionally, the cell of FIG. 7 is equivalent to the cell of FIG. 2. It represents a phase-shifting circuit of the all-pass type (i.e. having a substantially flat frequency response characteristic), which may be used in a circuit for creating a surround effect in a stereophonic play back system, as already mentioned above.

According to an embodiment of the invention, each cell (CELL 1, CELL 2, CELL 3, . . . , CELLn) of the nested serial circuit of FIG. 1, may have a circuit similar to the one depicted in FIG. 7. The integrated component of the RC network (in the specific instance the resistance R), which determines the central frequency $f_0$, is realized in the form of a plurality of integrated resistances: r1, r2, r3, . . . , rN, in series to each other. Each resistance has a value which is a fraction of the design value of the resistance R. Connected in parallel with each fractional component, there is an integrated by-pass switch (S1, S2, S3, . . . , SN), which may be controlled by the operator by programming or selection from a control panel. The driving circuit of the by-pass switches is not shown in the circuit diagrams of the figures, and may be easily realized in any suitable manner, as will be immediately clear to any skilled person. In this way, the cut-off or central frequency $f_0$ of each cell of the nested serial system of cells (FIG. 1) may be independently optimized, that is may be varied by the operator within a certain range, by setting the state of the by-pass switches S1, S2, S3, . . . , SN, in order to determine a certain effective value of the resistance R of the RC network of the cell.

The whole nested serial system, as schematically depicted in FIG. 1, assumes a surprising flexibility. In other words, an extremely large number of possible combinations are created, which will be relatively minimum when deriving the signal after the "first" few cells of the series and maximum when deriving the signal after the "last" cell of the series (CELLn). If the circuit of FIG. 1 comprises a number n of cells, and each cell (FIG. 7) is realized with a number N of configurable modules of resistance, the user will have available a number of combinations, that is a number of distinct effects that may be freely selected, given by:

$$\sum_{n=1}^{m} N^n$$

Of course, the by-passable modules of resistance: r1, r2, r3, ..., rN, as well as the by-pass switches: S1, S2, S3, SN, may be advantageously integrated. The configuring switches S1, S2, S3, ... SN, may be digitally controlled and therefore they may be realized with simple "transfer gates" which, if correctly dimensioned, will not penalize the system in terms of noise and/or distortion.

Typically, the stage selection be used to select the analog operation types to be performed (e.g. high-pass, low-pass, notch filter, etc.), while the variable stages were programmed to select the degree of modification desired. In the practical implementation of the invention, all stages had the same function (phase shifter stages). The selectable stages could also be different from each other and have different functions.

The circuit diagram of FIG. 8 shows a bi-quadratic cell, having a band-pass frequency response characteristic, that may be designed for producing either an attenuation or an amplification of the signal within the band, and which is functionally similar to the cell depicted in FIG. 4. The capacitance C of the RC network of the signal is, in the shown example of FIG. 8, constituted by an integrated capacitance Ci, having a relatively small value, suitably multiplied by a dedicated, integrated, capacitance-multiplying circuit. As will be evident to a technician, the equivalent capacitance C provided by the capacitance multiplier is given by: $C=Ci \cdot (R1/R2)$.

According to the present invention, one of the two branches (R1) of the voltage divider R1–R2, of the capacitance multiplying circuit, is realized in the form of a plurality of integrated resistances having fractional values: r1, r2 and r3, each resistance module may be short-circuited through a respective integrated switch: S1, S2, S3.

Also in this case, a nested serial system (FIG. 1), composed of a plurality of cells having a circuit as shown in FIG. 8, permits the "multiplication" of the number of selectable combinations in order to obtain as many different response characteristics.

Figure 9:
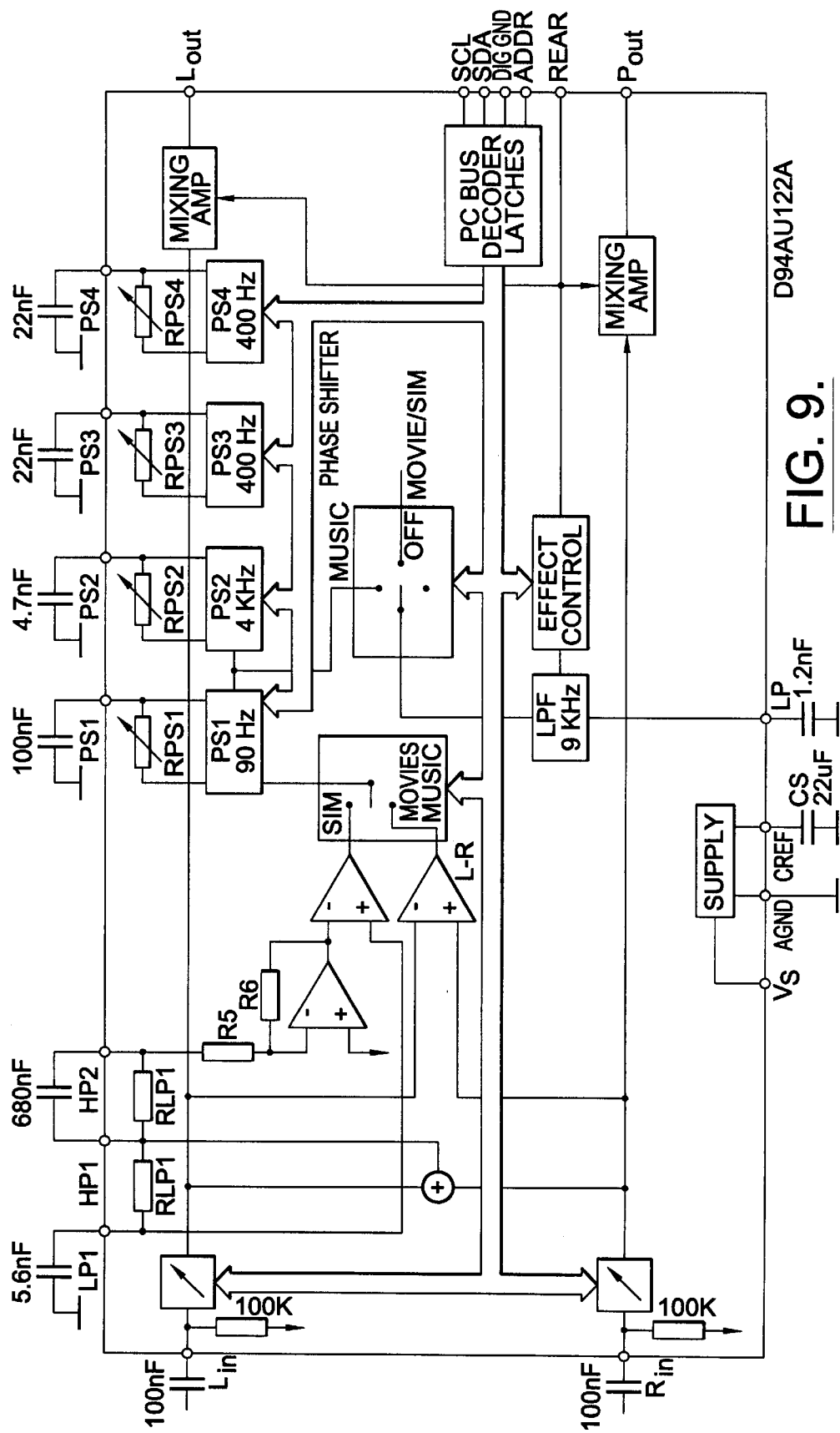
FIG. 9 shows a block diagram of a chip which uses an embodiment of the invention.

FIG. 9 is a block diagram of the TDA7346 chip manufactured by SGS-Thomson Microelectronics, which utilizes one embodiment of the invention in its chip for digitally controlled surround sound.

The invention is particularly useful in systems and subsystems that necessarily must have a low cost and a high level of compactness, as in the case of portable and car playback and radio systems. In these cases, considerations of cost, complexity and size of the integrated devices tend to exclude the option of adopting a parallel architecture and in these circumstances the present invention permits to achieve a surprisingly high flexibility of regulation while keeping low cost, complexity and size of the integrated circuits that make up the audio processor. Manufacturers of electonic systems generally seek the elimination of external components (commonly capacitors) in the specific case of circuits for equalization/modification of the response characteristics. This fact does not eliminate the possibility that the manufacturer of the system will want to implement specific default conditions, for example by establishing default configurations of the switches of the single cells of the nested serial system, which will account for the peculiar characteristics of other components of the system apparatus. Such a customizing, which commonly was made possible by choosing the values of the externally connected capacitors, is more accurately and easily implementable in a system of the invention by simply defining one, or even more advantageously several, selectable default configurations of the by-pass switches of the single cells (RC networks of the cells).

Naturally, several alternative embodiments are possible. In particular, an advantageous capacitance-multiplying circuit that may be usefully employed for implementing RC networks of single cells of a system made in accordance with the present invention, is described in a prior European patent application No. 92830419.5, filed on Jul. 28, 1992, by the same applicant, the description of which is herein incorporated by express reference.

As will be recognized by those skilled in the art, the innovative concepts described in the present application can be modified and varied over a tremendous range of applications, and accordingly the scope of patented subject matter is not limited by any of the specific exemplary teachings given. For example, as will be obvious to those of ordinary skill in the art, other circuit elements can be added to, or substituted into, the specific circuit topologies shown.

What is claimed is:

1. A frequency and/or phase response characteristic control circuit for a signal amplification system, the control circuit comprising:

a plurality of emphasis and/or de-emphasis and/or phase-shifting cells, each of said cells having a specific RC network capable of determining a certain response characteristic, said plurality of cells being connected in cascade; and at least one selector capable of selecting a node among a plurality of selectable nodes, each of said nodes being between ones of said cells, wherein at least one of said cells comprises:
a series of modules connected in series, each of said modules defining either a resistance value or a capacitance value;
a plurality of by-pass switches, each of said plurality of by-pass switches being capable of short-circuiting at least one of said modules; and
means for configuring the state of said switches.

2. A circuit as defined in claim 1, wherein said signal amplification system is an audio system, wherein capacitors of said RC networks of said cells are discrete components externally connected to an integrated circuit of the amplification system, and wherein said modules of said cells, said switches, and said configuring means are integrated.

3. A circuit as defined in claim 2, wherein all of the components of said RC networks of said cells are integrated.

4. A circuit as defined in claim 3, wherein said amplification system is an audio system, and at least a capacitor of said RC network of one of said cells comprises an integrated capacitance and an integrated capacitance-multiplying circuit, the multiplication factor of said capacitance-multiplying circuit being established by a resistive voltage divider, a resistance of which is supplied by said modules, the effective value of which is set by a certain configuration of said bypass switches.

5. An integrated circuit, comprising:
a plurality of filter stages connected in series to define at least one signal path, each of said plurality of filter stages having a specific RC network capable of determining a certain response characteristic; and at least one selector capable of selecting a node among a plurality of selectable nodes, each of said nodes being between ones of said plurality of filter stages, wherein at least one of said plurality of filter stages comprises:
a series of modules connected in series, each of said modules defining either a resistance value or a capacitance value;
a plurality of by-pass switches, each of said plurality of by-pass switches being capable of short-circuiting at least one of said modules; and
means for configuring the state of said switches.

6. An integrated circuit as defined in claim 5, wherein each of said plurality of filter stages is substantially all-pass filters capable of introducing phase-shift in a frequency band centered on a frequency $f_0$ of the audio spectrum.

7. An integrated circuit as defined in claim 5, where in each of said plurality of filter stages is substantially biquadratic cells, having a transfer function that comprises a quadratic function both in the numerator and in the denominator.

8. An integrated circuit as defined in claim 5, wherein each of said plurality of filter stages has a transfer function showing a frequency response characteristic of the band-pass type and a gain lower than or equal to unity.

9. An integrated circuit as defined in claim 5, wherein said plurality of filter stages each have a transfer function showing a frequency response characteristic of a high-pass type and a gain greater than unity.

10. An integrated circuit as defined in claim 5, wherein at least two of said plurality of filter stages each has a respective dynamically variable transfer function, and wherein at least one of said at least two filter stages comprise an op amp with a feedback connection which is both resistive and capacitive.

11. An integrated circuit as defined in claim 5, wherein at least two of said plurality of filter stages each has a respective dynamically variable transfer function, and wherein the value of said respective dynamically variable transfer function is determined by a plurality of integrated resistances connected in parallel and controlled by integrated by-pass switches.

12. An integrated circuit signal-processing method, comprising the steps of:

(a.) providing an integrated circuit which comprises a plurality of filter stages connected in series to define at least one signal path, each of said plurality of filter stages having a specific RC network capable of determining a certain response characteristic, and at least one selector capable of selecting a node among a plurality of selectable nodes, each of said nodes being between ones of said plurality of filter stages, wherein at least one of said plurality of filter stages includes a series of modules connected in series, each of said modules defining either a resistance value or a capacitance value, a plurality of by-pass switches, each of said plurality of by-pass switches being capable of short-circuiting at least one of said modules, and means for configuring the state of said switches;

(b.) configuring said by-pass switches to by-pass a selected number of said plurality of filter stages; and (c.) controlling individual ones of said plurality of filter stages to select a transfer function thereof.

13. A method as defined in claim 12, wherein each of said plurality of filter stages is substantially all-pass filters capable of introducing phase-shift in a frequency band centered on a frequency $f_0$ of the audio spectrum.

14. A method as defined in claim 12, wherein each of said plurality of filter stages is a substantially biquadratic cell having a transfer function that comprises quadratic functions both in the numerator and in the denominator.

15. A method as defined in claim 12, wherein each of said plurality of filter stages has a transfer function showing a frequency response characteristic of the band-pass type and a gain lower than or equal to unit.

16. A frequency and/or phase response characteristic control circuit for a signal amplification system, the control circuit comprising:

a plurality of filter stages connected in series to define at least one signal path, each of said plurality of filter stages having a specific RC network capable of determining a certain response characteristic; and at least one selector capable of selecting a node among a plurality of selectable nodes, each of said nodes being between ones of said plurality of filter stages, wherein at least one of said plurality of filter stages comprises:
a series of modules connected in series, each of said modules defining either a resistance value or a capacitance value;
a plurality of switches, each of said plurality of switches being capable of short-circuiting at least one of said modules; and
means for configuring the state of said switches.

17. A control circuit as defined in claim 16, wherein said amplification system is an audio system, and at least a capacitor of said RC network of one of said plurality of filter stages comprises an integrated capacitance and an integrated capacitance-multiplying circuit, the multiplication factor of said capacitance-multiplying circuit being established by a resistive voltage divider, a resistance of which is supplied by said modules, the effective value of which is set by a certain configuration of said switches.

18. A control circuit as defined in claim 16, wherein at least two of said plurality of filter stages each has a respective dynamically variable transfer function, and where in at least one of said at least two filter stages comprise an op amp with a feedback connection which is both resistive and capacitive.

19. A control circuit as defined in claim 16, wherein at least two of said plurality of filter stages each has a respective dynamically variable transfer function, and wherein the value of said respective dynamically variable transfer function is determined by a plurality of integrated resistances connected in parallel and controlled by integrated by-pass switches.

* * * * *

UNITED STATES PATENT AND TRADEMARK OFFICE
CERTIFICATE OF CORRECTION

PATENT NO. : 5,812,687
DATED : September 22, 1998
INVENTOR(S) : Andrea Mario Onetti, and Maurizio Tonella It is certified that error appears in the above-identified patent and that said Letters Patent is hereby corrected as shown below:

Column 7, Line 17  Strike:

" where in "

Insert:

-- wherein --

Column 8, Line 48  Strike:

" where in "

Insert:

-- wherein --

Signed and Sealed this

Eleventh Day of May, 1999

Attest:

Q. TODD DICKINSON

Attesting Officer

Acting Commissioner of Patents and Trademarks

UNITED STATES PATENT AND TRADEMARK OFFICE
CERTIFICATE OF CORRECTION

PATENT: 5,812,687

DATED: September 22, 1998

INVENTOR (S): Andrea Mario Onetti et al.

It is certified that error appears in the above-identified patent and that said Letters Patent is hereby corrected as shown below:

On the title page, item [73], insert the following :-- SGS-Thomson Microelectronics S.r.l Agrate Brianza, Italy--.

Signed and Sealed this

Twenty-fourth Day of August, 1999

Attest:

Q. TODD DICKINSON

*Attesting Officer*  Acting Commissioner of Patents and Trademarks